United States Patent [19]

Suzuki

[11] Patent Number: 4,796,264
[45] Date of Patent: Jan. 3, 1989

[54] SEMICONDUCTOR LASER DRIVER

[75] Inventor: Akira Suzuki, Tokyo, Japan

[73] Assignee: NEC Corporation, Tokyo, Japan

[21] Appl. No.: 735,602

[22] Filed: May 20, 1985

[30] Foreign Application Priority Data

May 23, 1984 [JP] Japan .................................. 59-103872

[51] Int. Cl.⁴ .............................................. H01S 3/13
[52] U.S. Cl. ........................................ 372/29; 372/32;
372/38; 331/107 R; 455/609; 307/311
[58] Field of Search ............................. 372/32, 29, 38;
307/311, 270; 331/107 R; 455/609

[56] References Cited

U.S. PATENT DOCUMENTS 4,081,670 3/1978 Albanese ................................ 372/26
4,400,812 6/1983 Clark et al. ............................ 372/29

FOREIGN PATENT DOCUMENTS 0148879 11/1981 Japan ..................................... 372/29
0035494 2/1984 Japan ..................................... 372/28

OTHER PUBLICATIONS

Ohishi et al, "Lowering of Noises in Semiconductor Laser by High Frequency Superposition and Longitudinal Mode Characteristics", Collection of Proposed Lectures for the 44th Conference of the Society of Applied Physics, p. 102.
Katz, et al, "The Intrinsic Electrical Equivalent Circuit of a Laser Diode", IEEE Journal of Quantum Electronics, vol. QE-17, No. 1, Jan. 1981, pp. 4-7.

Primary Examiner—William L. Sikes
Assistant Examiner—Georgia Y. Epps
Attorney, Agent, or Firm—Foley & Lardner Schwartz, Jeffery, Schwaab, Mack, Blumenthal & Evans

[57] ABSTRACT

A semiconductor laser driver comprises a high frequency amplifier. Positive feedback from a load, including a semiconductor laser, is input to the amplifier. This arrangement provides self-sustained oscillation of the circuit at the relaxation oscillation frequency of the semiconductor laser, thus eliminating the need for an external oscillator.

1 Claim, 1 Drawing Sheet

SEMICONDUCTOR LASER DRIVER

BACKGROUND OF THE INVENTION

1. Field of the Invention

The present invention concerns an improvement to a driver for semiconductor lasers used in optical data processing and fiber optic transmission.

2. Prior Art

Because of the high optical output, small size and light weight, the practical application of semiconductor lasers is rapidly spreading as a light source for optical data processing and fiber optic transmission systems. Single mode semiconductor lasers with a stabilized transverse mode have been developed for such purposes. However, when the single transverse mode laser is used with such equipment or systems, mode hopping noises are induced in the laser by a substantial reflection of light from the various components of the system, thereby presenting grave problems in practical application.

As is shown in Ohishi et al's paper "Lowering of noises in semiconductor laser by high frequency superposition and longitudinal mode characteristics" published in Collection of Proposed Lectures for the 44th Conference of the Society of Applied Physics, page 102, an external oscillator is employed to apply high frequency current near the relaxation oscillation frequency of the semiconductor laser. A driver is employed for matching the frequency to the single transverse mode semiconductor laser in order to stably maintain the longitudinal multimode oscillation and to lower the coherence. However, the adoption of such a driver not only renders the laser device complex and expensive, but also requires the adjustment of the oscillating frequency, current amplitude and DC bias current of the external oscillator for every semiconductor laser used. This necessary adjustment comes from the fact that the noise characteristics vary greatly depending on the structural parameters and operational conditions of each semiconductor laser.

SUMMARY OF THE INVENTION

It is an object of the present invention to eliminate the above mentioned defects by eliminating the need for an external oscillator.

Another object of the invention is to offer semiconductor laser driver which stably maintains the longitudinal multimode oscillation of the semiconductor laser.

Th semiconductor laser driver according to the present invention is characterized in that a load circuit including a semiconductor laser is connected to an output of a high frequency amplifier, and that a positive feedback circuit is connected between the load circiit and an input of the high frequency amplifier.

DETAILED DESCRIPTION OF THE PREFERRED EMBODIMENT

Figure 1:
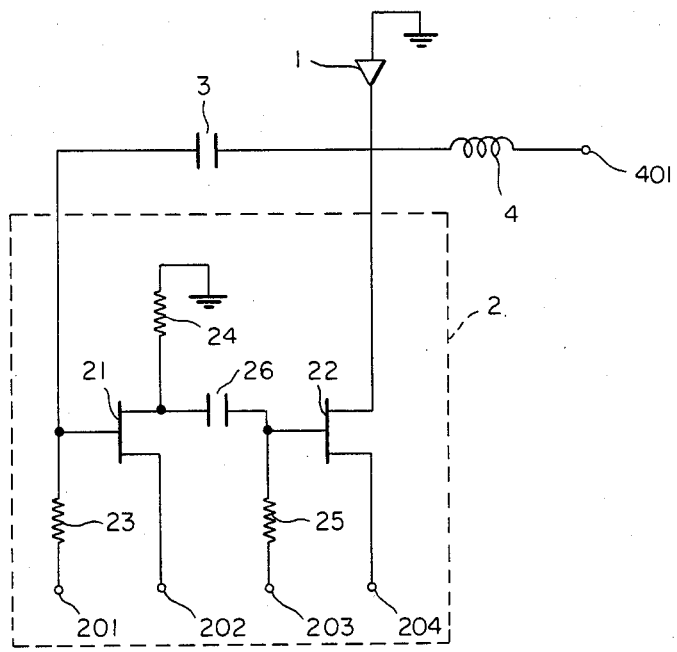
FIG. 1 is a circuitry diagram of the embodiment according to the present invention.

A preferred embodiment of the present invention shown in FIG. 1 includes a semiconductor laser 1, transistors 21, 22, resistors 23, 24, 25, capacitors 26, 3, and a coil 4. The transistors 21, 22 are those for high frequency amplification, and the resistors 23, 25 are gate bias resistors of 5 KΩ respectively. The resistor 24 is a load resistor of 400 Ω, while the capacitor 26 is a coupling capacitor of 10 pF for the transistors 21, 22. A first terminal 201 is the gate bias terminal for the transistor 21, a second terminal 202 is the source bias terminal for the transistor 21, a third terminal 203 is a gate bias terminal for the transistor 22, and a fourth terminal 204 is a source bias terminal of the transistor 22, each of which is applied with a suitable bias voltage. The transistors 21, 22, the resistors 23, 24, 25 and the capacitor 26 make up a high frequency amplifier 2. The capacitor 3 is a positive feedback capacitor connected between the semiconductor laser 1 which becomes the load on the high frequency amplifier 2 and the input of said amplifier 2 and has a capacitance of 10 pF. The coil 4 is of 50 nH and is for applying bias on the direct current to the semiconductor laser 1. On the semiconductor laser 1 is applied appropriate DC bias from a bias terminal 401.

Figure 2:
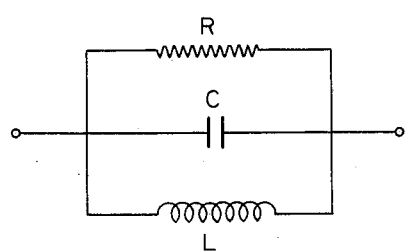
FIG. 2 is an equivalent circuit for a semiconductor laser.

The present invention utilizes the impedance characteristics in the high frequency band of the semiconductor laser. The high frequency impedance of the semiconductor laser operating under the bias conditions exceeding the oscillation threshold value becomes the resistive impedance with finite values because the transient changes of injection carrier concentration follow the injection high frequency current only in the vicinity of the relaxation oscillating frequency. In other words, an electrically equivalent circuit of the semiconductor laser is represented as a parallel resonant circuit of a capacitance C, an inductance L and a resistance R of which resonance frequency is equal to the relaxation oscillation frequency as shown in FIG. 2 (See, for example, J. Katz et al, "The Intrinsic Electrical Equivalent Circuit of a Laser Diode", IEEE JOURNAL OF QUANTUM ELECTRONICS, Vol.QE-17, No. 1, January 1981, pp. 4–7.) If the cutoff frequency of the high frequency amplifier is sufficiently high, the gain of the loop, including the load circuit and the feedback circuit, is larger than 1, and phase-matching is achieved. Thus, the circuit as a whole operates as a self-sustained oscillator which oscillates near the relaxation oscillation frequency of the semiconductor laser 1. This causes the concentration of the injection carrier of the semiconductor laser 1 to constantly vary, and the laser oscillation to occur stably in multimode. In one design example, where oscillating threshold current for the semiconductor laser 1 is assembled to be 25 mA, and DC bias current 50 mA, the impedance of the laser 1 at the relaxation oscillation frequency will become approximately 1 Ω. If mutual conductance of the transistors 21, 22 is set above 50 mS, then the loop gain becomes greater than 1, thereby satisfying the conditions for self-sustained oscillation. As explained above, the present invention offers a simple circuit construction without requiring the use of an external oscillator and enables the stable multimode oscillation of the semiconductor laser. The present invention further enables determination of its self-sustained oscillation frequency by the relaxation oscillation frequency of the semiconductor laser alone. Therefore, the present invention is uniquely characterized in that it is operable under arbitrary structure parameters and operational conditions of the semiconductor laser so long as the loop gain is appropriately designed.

The circuit constants given for the above embodiment are naturally not to be limited thereto. A circuit including any values of inductance, resistance and capacitance may be used as a feedback circuit in lieu of a feedback capacitor 3 so long as it meets the conditions that the loop gain is greater than 1 and the phases are matched in respect to relaxation oscillation frequency of the semiconductor laser. Any circuit including inductance, resistance and capacitance may be connected in series or parallel to the semiconductor laser 1. A plural number of semiconductor lasers 1 may also be connected in series. The high frequency amplifier 2 ma be other than that with the two stage common-source structure. Any circuit construction may be used so long as it is capable of amplification.

As has been described in detail, the present invention offers a semiconductor laser driver of a simple construction capable of operating under arbitrary structural parameters and operational conditions of a semiconductor laser, and of stably maintaining the longitudinal multimode oscillation of the semiconductor laser by connecting the load circuit including the semiconductor laser to the output of a high frequency amplifier, and connecting the positive feedback circuit between the load circuit and the input of the high frequency amplifier, thereby causing the circuit including the semiconductor laser to perform self-sustained oscillation near its relaxation oscillation frequency.

What is claimed is:
1. A semiconductor laser oscillator comprising:
a semiconductor laser having a threshold level;
a means, electrically connected to a first electrode of said semiconductor laser, for supplying a bias current to said semiconductor laser beyond the threshold level of said semiconductor laser;
a high frequency amplifier means, electrically connected to said first electrode of said semiconductor laser, for amplifying a high frequency input to produce a high frequency output current, said high frequency output current being superposed with said bias current and provided to said semiconductor laser;
means, electrically connected between said first electrode of said semiconductor laser and an input terminal of said high frequency amplifier means, for providing positive feedback from said semiconductor laser as said high frequency input of said amplifier means; and
wherein said high frequency amplifier means electrically oscillates near the relaxation oscillation frequency of said semiconductor laser, and said semiconductor laser generates laser light in the longitudinal multimode oscillation.

* * * * *